(12) United States Patent
Keam et al.

(10) Patent No.: US 10,177,019 B2
(45) Date of Patent: Jan. 8, 2019

(54) VACUUM-ASSISTED VESSEL ENVIRONMENTAL CONTAMINANT PURGING

(71) Applicant: Samsung Electronics Co., Ltd., Suwon-si, Gyeonggi-do (KR)

(72) Inventors: YongHwan Keam, Austin, TX (US); Marc McClendon, Georgetown, TX (US); Jaison Roy, Austin, TX (US); Qasim Jawad, Austin, TX (US); Matt Gonzales, Austin, TX (US); DongYoung Ko, Austin, TX (US); Sean Chang, Georgetown, TX (US)

(73) Assignee: SAMSUNG ELECTRONICS CO., LTD. (KR)

( * ) Notice: Subject to any disclaimer, the term of this patent is extended or adjusted under 35 U.S.C. 154(b) by 173 days.

(21) Appl. No.: 15/276,789

(22) Filed: Sep. 26, 2016

(65) Prior Publication Data

US 2018/0090355 A1 Mar. 29, 2018

(51) Int. Cl.
*H01L 21/67* (2006.01)
*H01L 21/673* (2006.01)
*H01L 21/677* (2006.01)

(52) U.S. Cl.
CPC .... *H01L 21/67389* (2013.01); *H01L 21/6773* (2013.01)

(58) Field of Classification Search
CPC ............... H01L 21/6773; H01L 21/67389
USPC .................................................. 141/65, 98
See application file for complete search history.

(56) References Cited

U.S. PATENT DOCUMENTS

| 6,123,120 | A * | 9/2000 | Yotsumoto | H01L 21/67769 141/59 |
| 6,199,604 | B1 * | 3/2001 | Miyajima | H01L 21/67017 141/348 |
| 6,267,158 | B1 * | 7/2001 | Saga | H01L 21/67253 141/65 |
| 6,688,344 | B2 * | 2/2004 | Hu | H01L 21/67393 141/1 |

(Continued)

OTHER PUBLICATIONS

Hu et al., "Design and evaluation of a nitrogen purge system for the front opening unified pod (FOUP)," Applied Thermal Engineering, vol. 27, Jun. 2007, pp. 1386-1393, Elsevier, 5 pages.

(Continued)

*Primary Examiner* — Timothy L Maust
(74) *Attorney, Agent, or Firm* — Renaissance IP Law Group LLP

(57) ABSTRACT

Methods are disclosed for purging contaminants from a vessel such as a FOUP with vacuum-assistance. After the vessel is purged of environmental contaminants with a purging medium, the vessel is pressurized with a pressurizing medium such as nitrogen ($N_2$) gas to yield a desired atmosphere. After the vessel has been pressurized via either negative or positive pressure, the vessel is transported to a storage location that is a non-purge storage and that is physically separate from the charging station, such as a stocker. The vessel can be left in non-purge storage for an amount of time and then the cycle can be repeated if the vessel has not been utilized in another processing step such as another processing step for manufacturing semiconductor wafers.

19 Claims, 3 Drawing Sheets

(56) References Cited

U.S. PATENT DOCUMENTS

| | | | |
|---|---|---|---|
| 7,568,875 B2 | 8/2009 | Le Guet et al. | |
| 7,841,371 B2 * | 11/2010 | Okabe | H01L 21/67017 |
| | | | 141/51 |
| 9,105,673 B2 * | 8/2015 | Babbs | H01L 21/67201 |
| 9,257,320 B2 | 2/2016 | Fosnight et al. | |
| 9,837,293 B2 * | 12/2017 | Lai | H01L 21/67393 |
| 2002/0124906 A1 * | 9/2002 | Suzuki | H01L 21/67017 |
| | | | 141/98 |
| 2003/0035713 A1 | 2/2003 | Tsai et al. | |
| 2014/0112739 A1 | 4/2014 | Hirano et al. | |
| 2015/0234378 A1 | 8/2015 | Fosnight et al. | |

OTHER PUBLICATIONS

Hu et al., "Particle Dynamics in a Front-Opening Unified Pod/Load Port Unit Minienvironment in the Presence of a 300 mm Wafer in Various Positions," Mar. 2005, vol. 39, pp. 185-195, Taylor and Francis Inc., 12 pages.

Hunter et al., "Trends in 300 mm factory automation," Jun. 2003, vol. 26, pp. 60-64, Reed Business Information, 3 pages.

Keyhani et al., "Purging FOUPs that open to front-end minienvironments using an inert-gas curtain," Aug.-Sep. 2004, Micro, vol. 22, pp. 65-71, Canon Communications, USA, 7 pages.

Seita et al., "Improvement of 300mm FOUP Mini-environment," IEEE International Symposium on Semiconductor Manufacturing, Oct. 8-10, 2001, San Jose, CA, USA, IEEE, 4 pages.

* cited by examiner

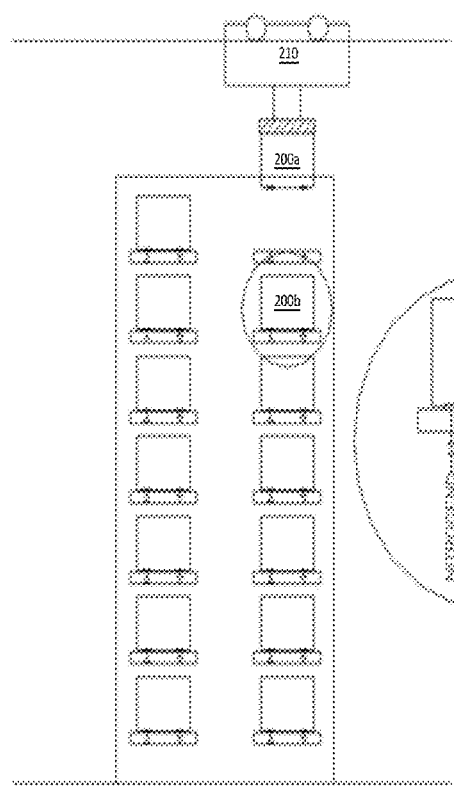
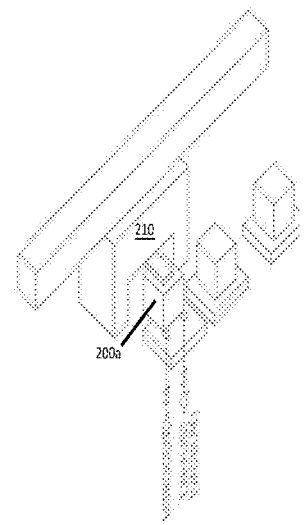
Stocker
Side Track Buffer
FIG. 3A
FIG. 3B

VACUUM-ASSISTED VESSEL ENVIRONMENTAL CONTAMINANT PURGING

TECHNICAL FIELD

The present disclosure relates to methods for purging contaminants from a vessel with vacuum-assistance.

BACKGROUND

It is essential to keep matter (particles, gases, etc.) from contaminating wafers in the process of manufacturing semiconductor devices. As an example, a front opening universal pod (FOUP) is an example of a vessel or carrier that encloses wafers to keep contamination from the wafers. However, efforts are required to minimize the presence of contaminants within a vessel such as FOUP.

Environmental contaminants from a FOUP in a cleanroom semiconductor wafer processing facility are routinely removed or controlled. Examples of such methods are disclosed in U.S. Patent Publication No. 2014/0112739, U.S. Pat. No. 9,257,320, U.S. Patent Publication No. 2015/0234378, U.S. Patent Publication No. 2003/035713, U.S. Pat. Nos. 9,105,673, and 7,568,875. Other literature examples include: (1) Hu et al., Japanese Journal of Applied Physics, vol. 45, pp. 5269-5271, Japan Society of Applied Physics; (2) Seita et al., IEEE International Symposium on Semiconductor Manufacturing, Oct. 8-10, 2001, San Jose, Calif., USA, IEEE; (3) Keyhani et al., August-September 2004, Micro, vol. 22, pp. 65-71, Canon Connnunications, USA; (4) Hu et al., March 2005, vol. 39, pp. 185-195, Taylor and Francis Inc.; (5) Hunter et al., June 2003, vol. 26, pp. 60-64, Reed Business Information; and (6) Hu et al., Applied Thermal Engineering, vol. 27, June 2007, pp. 1386-1393, Elsevier.

SUMMARY

Exemplary embodiments of the inventive concept provide improved methods for purging contaminants from a vessel with vacuum-assistance. In one embodiment, the method may include the following steps: (a) purging a vessel, such as a FOUP, of environmental contaminants with a purging medium; after completion of a processing step, such as a processing step for manufacturing semiconductor wafers; (b) pressurizing the vessel at a charging station with a pressurizing medium to yield a desired atmosphere. The purging medium and the pressurizing medium may be nitrogen ($N_2$). After the vessel has been pressurized via either negative or positive pressure, additional steps occur in the method including: (c) transporting the vessel to a storage location that is separate from the charging station; (d) storing the vessel in non-purge storage such as a stocker; (e) leaving in non-purge storage for an amount of time; and (f) repeating steps (a)-(e), if the vessel has not been utilized in another processing step such as another processing step for manufacturing semiconductor wafers. The purging medium and/or pressurizing medium may be at least about 99.9% pure nitrogen ($N_2$) gas.

Prior art methods of removing environmental contaminants from a FOUP in a cleanroom semiconductor wafer processing facility by purging with nitrogen ($N_2$) relied primarily on two mechanisms. One mechanism relied on air porosity, gaps, incomplete connections, or other leaks in the gaskets, seals, and materials that separate the atmosphere inside the FOUP from that around it. In another mechanism, the inability for the FOUP to maintain a positively pressurized atmosphere relative to the surrounding environment via by one-way valve or other feature is a disadadvantage. While not necessarily true of all brands of readily available FOUPs, it is particularly problematic for certain less expensive FOUPs that do not contain a "snorkel" for facilitating inlet gas diffusion across all 25 wafers because such FOUPs exhibit a significantly faster loss of internal pressure than others.

The embodiments disclosed herein avoid the problems of the prior art and instead leverage the strengths of the negative or positive pressure to greatly increase the rate of acquisition of the target atmospheric environment. The relative flow rates of an inlet supply and an outlet vacuum can prepare either a positively pressurized or negatively pressurized environment inside the vessel. Used in conjunction with electronically controlled valves and a controller, whether electronic or software or mechanical, advanced utilization of the raw materials may be obtained, resulting in a reduction of operating costs in parallel with the process precision improvements contained herein. Preparation of a more pure target environment (low gas distribution entropy) yields an increased removal rate of diffused contaminants where undesired incursions of the external environment are prohibited, where the target environment is designed to maximize the diffusive flow of the undesired chemical contaminant(s) therein.

The methods disclosed herein reduce manufacturing product particle defects such as semiconductor wafer particle defects. As a result, the methods disclosed herein provide increased semiconductor wafer die yield.

BRIEF DESCRIPTION OF THE DRAWINGS

The written disclosure herein describes illustrative embodiments that are non-limiting and non-exhaustive. Reference is made to certain of such illustrative embodiments that are depicted in the figures, as listed below.

FIG. 3A is a schematic of a vessel, such as a FOUP, being moved via a conveyor to a stocker.

FIG. 3B is a schematic of a conveyor moving a vessel, such as a FOUP.

DETAILED DESCRIPTION

Various exemplary embodiments will be described more fully hereinafter with reference to the accompanying drawings. The present inventive concept may, however, be embodied in many alternate forms and should not be construed as limited to the example embodiments set forth herein. Rather, these example embodiments are provided so that this description will be thorough and complete, and will fully convey the scope of the present inventive concept to those skilled in the art.

In one embodiment, the method utilizes a vacuum outlet port and electronic monitoring of the operating conditions thereof to a vessel that is purged of environmental contaminants, whether solid, liquid (including aqueous), or gaseous or dissolved into desirable features of the product contained within or of the material of the vessel itself. The method uses a purging medium of a desirable environment, whether liquid or gaseous.

The method may involve use of a FOUP wafer vessel that is purged with filtered, high purity, subsonic nitrogen gas in conjunction with a variable pressure vacuum outlet and electronic process conditions monitoring of the same. Supply nitrogen gas is provided at higher flow rate than is supported by the vacuum pump alone, resulting in a positively-pressurized atmosphere inside a target FOUP. Used in conjunction with enhanced atmospheric seals on FOUP door and inlet/outlets, the method allows the target atmosphere to be maintained for an extended period after the FOUP has left the invention equipment.

Figure 1:
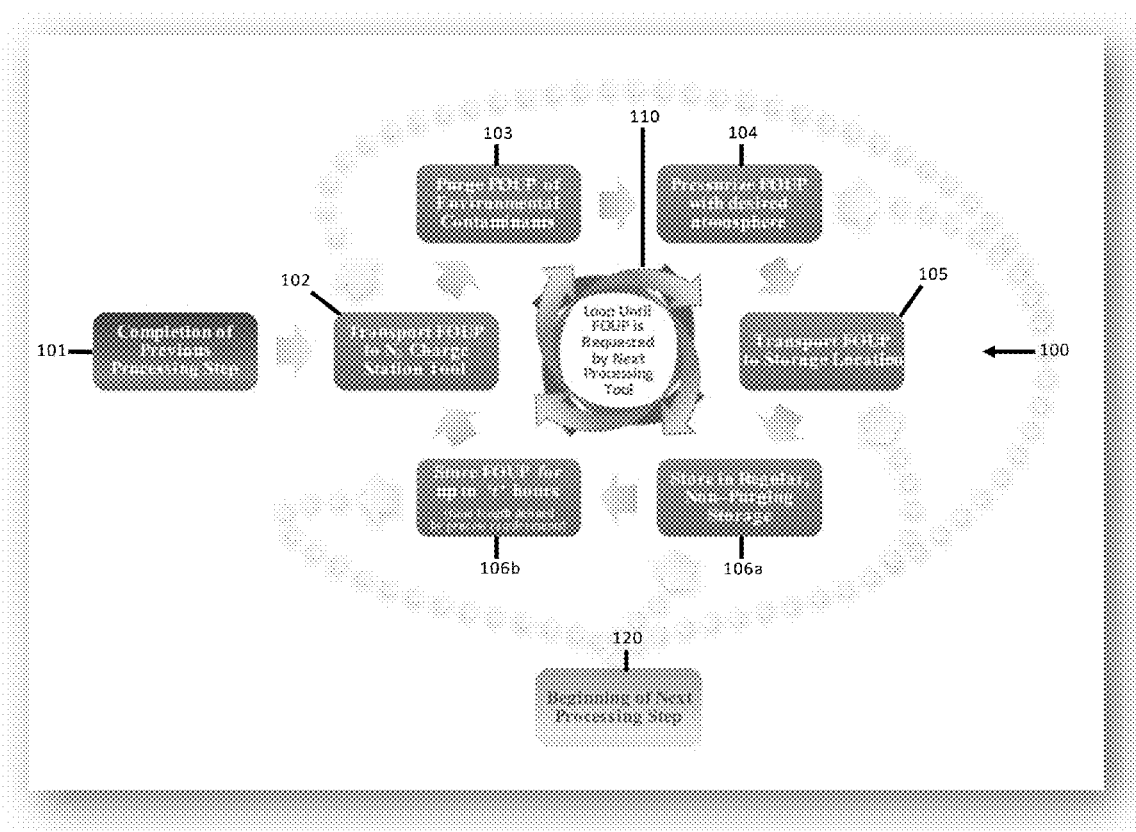
FIG. 1 is a flow chart of a cycle for purging contaminants from a vessel with vacuum-assistance.

FIG. 1 depicts an embodiment of a method for purging contaminants from a vessel with vacuum-assistance. The method is depicted generally at 100 and begins after completion of a processing step as shown at 101. The FOUP is transported to a nitrogen ($N_2$) charging station as shown at 102. The FOUP is purged of environmental contaminants as shown at 103. For example, the FOUP may be connected at 1-3 inlet nozzles with a gas and may have at least one outlet nozzle that is connected to a vacuum pump. The FOUP may be under a positive pressure or a negative pressure.

The FOUP is then pressurized with nitrogen ($N_2$) to yield a desired atmosphere as shown in 104. The desired atmosphere may result from positive pressure or negative pressure. The FOUP is then transported, as shown at 105, to a storage location that is separate from the nitrogen ($N_2$) charging station. The FOUP is stored, as shown at 106a, at a non-purging storage location. The FOUP may be stored for any amount of time. For example, the FOUP may be stored for a designated amount of time that, as shown at 106b, is defined by process requirements. The FOUP is then moved to the nitrogen ($N_2$) charging station at 101 to repeat the loop as shown at 110 unless the FOUP is requested by the next processing step as shown at 120.

Figures 2A, 2B:
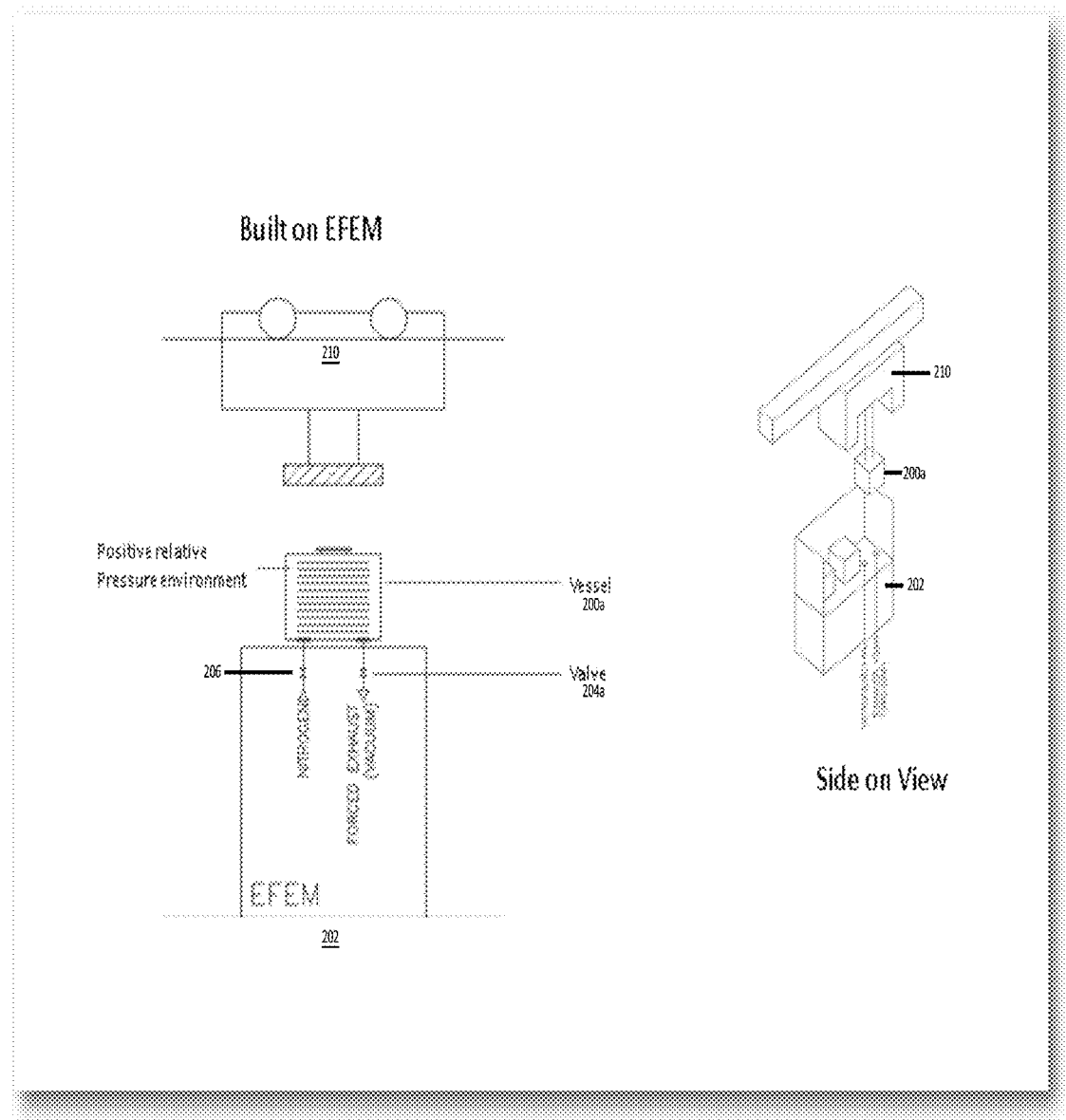
FIG. 2A is a schematic of a vessel, such as a FOUP, on an EFEM being purged or pressurized.
FIG. 2B is a schematic of a conveyor moving a vessel, such as a FOUP, to an EFEM to be purged or pressurized.

FIG. 2A and FIG. 2B depict a vessel 200a. FIG. 2A shows the vessel 200a on an equipment front end module (EFEM) 202. Vessel 200, which may be a FOUP, is shown in FIG. 2B being moved by a conveyor 210. On the EFEM in FIG. 2A, the vessel 200a receives nitrogen ($N_2$) via a valve 206 and exhaust is forced out of vessel 200a via a valve 204 that is in communication with a vacuum.

FIG. 3A and FIG. 3B show vessel 200a being moved by conveyor 210. FIG. 3A shows vessel 200a being moved to a stocker 220 and also shows other vessels that are already positioned in the stocker 220 such as vessel 200b.

The introduction of a negative pressure (vacuum) outlet provides an increase of +1000→3000% volumetric flow when using air as the working fluid. In comparison with the existing industry-standard operation in semiconductor wafer processing, this increase in volumetric flow provides several immediate benefits.

One benefit of the increased volumetric flow is an increased rate of target atmospheric environment acquisition. Used in conjunction with electronically controlled valves and a controller, whether electronic or software or mechanical, advanced utilization of the raw materials may be obtained, resulting in a reduction of operating costs in parallel with the process precision improvements contained herein.

Weighing the costs and benefits of each option when customizing the method involves consideration of various issues to maximize usefulness. For example, if the purging medium is 99.9% pure nitrogen gas and onsite-production of such is available, it may likely be more cost beneficial to flush a higher volume of the purge medium through the vessel to obtain the best possible contaminant reduction. If the purging medium is 99.9999% pure nitrogen gas, the gas cost may likely limit the volume fiscally available.

Another benefit of the increased volumetric flow is significantly shortening the contaminant purging process while obtaining comparable results with prior art processes. This opens the process design to two distinct paths as well as any gradient point between. In the first path, the process enables shortening of the contaminant purging process, continuing to use the existing quality targets, and either investing the saved equipment, time, manpower, and supplies into higher production capacity or fiscal profits. The second path permits re-planning of the contaminant purging process to require the same amount of time as the previously existing conditions and investing the process quality gains into more stringent quality targets. For example, assume a prior art method required 30 minutes of environmental contaminant purging to achieve a 10 ppm cleanliness measurement while an embodiment of the methods described herein only requires 15 minutes to achieve the same quality result. One option (A) would run a disclosed method in 15 minutes, allow for a 50% savings of the equipment, manpower, and utilization-variable costs, and either double the number of vessels purged or produce the original capacity and reduce the associated costs by half. Another option (B) would run a disclosed method for the original 30 minutes but reduce the environmental contaminants to a 4 ppm measurement.

An additional benefit of the increased volumetric flow is faster internal purging fluid flow rates, which increases the removal rate of particulate contaminant. Another benefit is a reduction in manufacturing product particle defects. For example, reducing $H_2O$ (liquid and vapor) and oxygen ($O_2$) gas inside the FOUP environment inhibits oxide bridge growth, thereby reducing the number of failed chips after burn-in testing and increasing die yield. The disclosed methods provide an increased rate of target atmospheric environment acquisition. For example, improved FOUP-internal flow velocity pathways have a marked reduction of stagnant-flow regions and an increased rate of contaminant diffusion at stagnation points, parallel to the velocity gradient vector.

The methods disclosed herein also reduce internal vessel environmental contaminants. This is applicable to the reduction of internal vessel environmental contaminants or any other undesirable oxidation or incidental surface boundary chemical reaction. For example, the disclosed methods yield a reduction in free-floating contaminant particles in a FOUP atmosphere; a reduction in sufficiently-loosely-adhering contaminant particles on silicon wafers deposited during the prior production step; and a reduction in undesirable oxidation or other undesirable chemical reaction product that is solid, liquid, aqueous, or gas. The contaminants can be the result of extraneous chemical contamination of the prior production step or the undesired diffusion (or outgassing) of a dissolved chemical contaminant in a desirable semiconductor feature.

The methods disclosed herein also improve safety over the use of conventional nitrogen ($N_2$) purge stockers by eliminating "confined space" work, reducing human exposure to saturated nitrogen ($N_2$) gas environment, and eliminating required per-worker monitoring of oxygen ($O_2$) gas concentration levels.

As indicated above, the relative flow rates of the inlet supply and outlet vacuum can prepare either a positively pressurized or negatively pressurized environment inside the vessel. Preparation of a positively pressurized vessel environment yields an increased protection from outside environmental contamination. Preparation of a negatively pressurized vessel environment yields an increased removal rate of diffused contaminants where undesired incursions of the external environment are prohibited. Both conditions have other strengths, limitations, and intended applications. For example, with a FOUP that is known to possess imperfect sealing gaskets separating the surrounding environment, a positive internal relative pressure will limit contaminant introduction by prohibitively increasing the particle transition entropy, preventing migration in through leaks. For a vessel known to have zero incidental leaks, a negatively pressurized internal environment can greatly increase the diffusion rate for undesirable dissolved contaminants in either desirable features inside the vessel or the materials of the vessel itself.

COMPARATIVE EXAMPLE

The following is an example of methods for purging contaminants from a vessel with vacuum-assistance. Such exemplary manufacturing conditions are given by way of example, and not by limitation, in order to illustrate compositions that have been found to be useful.

In semiconductor wafer processing, assume that a method (A) is initially used comprising the following steps: (1) purging FOUP environmental contaminants; (2) transporting the FOUP; (3) storing in non-purge storage; (4) leaving in storage (waiting) up to a predetermined length of time; (5) if FOUP has still not been processed, transporting FOUP back to purging equipment; (6) repurging FOUP environmental contaminants; (7) going to step (1) and then looping through the other steps until FOUP is sent for processing at next step. Assume also that method (A) is replaced by method (B), which involves: (1) purging FOUP environmental contaminants; (2) pressurizing the FOUP with nitrogen ($N_2$) to yield a desired atmosphere; (3) transporting the FOUP to a storage location that is separate from the nitrogen ($N_2$) charging station; (4) storing in non-purge storage; (5) leaving in storage (waiting) up to a predetermined length of time; (6) if FOUP has still not been processed, transporting FOUP back to purging equipment; (7) repurging FOUP environmental contaminants; (8) going to step (1) and then looping through the other steps until FOUP is sent for processing at next step. Shortening the contaminant purging process time required by method (A) can substantially increase the total number of storage locations and FOUPs supported in a continuous-storage-repurge model, which results in lower equipment costs. For example, if method (A) required 20 minutes of environmental contaminant purging and method (B) requires only 15 minutes to achieve the same quality result, there are significant benefits. If the operating conditions for both methods mandated repurging once every 7 hours and involved an average of 3.5 minutes delivery to and from the equipment, 80% target equipment utilization, a 7% increased cost per tool installed with a purging vacuum pump, an average of 2.5 loadports/purging equipment tool, and a constant 5000 lots requiring purging at all times then method (A) would require 23.5 minutes of cycle time per lot versus 18.5 minutes of cycle time for method (b). Methods (A) and (B) can support 14 and 18 lots per purging loadport, respectively, resulting in requirements of 140 tools using method (A) and 111 tools using method (B). This scenario's net result of 20% fewer tools yields a greater than 15% reduction in installation and fixed tool costs for method (B) relative to method (A).

Any methods disclosed herein comprise one or more steps or actions for performing the described method. The method steps and/or actions may be interchanged with one another. In other words, unless a specific order of steps or actions is required for proper operation of the embodiment, the order and/or use of specific steps and/or actions may be modified. Recitation in the claims of the term "first" with respect to a feature or element does not necessarily imply the existence of a second or additional such feature or element.

References to approximations are made throughout this specification, such as by use of the terms "about" or "approximately." For each such reference, it is to be understood that, in some embodiments, the value, feature, or characteristic may be specified without approximation. For example, where qualifiers such as "about," "substantially," and "generally" are used, these terms include within their scope the qualified words in the absence of their qualifiers.

Reference throughout this specification to "an embodiment" or "the embodiment" means that a particular feature, structure or characteristic described in connection with that embodiment is included in at least one embodiment. Thus, the quoted phrases, or variations thereof, as recited throughout this specification are not necessarily all referring to the same embodiment.

Similarly, it should be appreciated that in the above description of embodiments, various features are sometimes grouped together in a single embodiment, figure, or description thereof for the purpose of streamlining the disclosure. This method of disclosure, however, is not to be interpreted as reflecting an intention that any claim require more features than those expressly recited in that claim. Rather, as the following claims reflect, inventive aspects lie in a combination of fewer than all features of any single foregoing disclosed embodiment.

The claims following this written disclosure are hereby expressly incorporated into the present written disclosure, with each claim standing on its own as a separate embodiment. This disclosure includes all permutations of the independent claims with their dependent claims. Moreover, additional embodiments capable of derivation from the independent and dependent claims that follow are also expressly incorporated into the present written description. These additional embodiments are determined by replacing the dependency of a given dependent claim with the phrase "any of the preceding claims up to and including claim [x]," where the bracketed term "[x]" is replaced with the number of the most recently recited independent claim. For example, for the first claim set that begins with independent claim 1, claim 3 can depend from either of claims 1 and 2, with these separate dependencies yielding two distinct embodiments; claim 4 can depend from any one of claim 1, 2, or 3, with these separate dependencies yielding three distinct embodiments; claim 5 can depend from any one of claim 1, 2, 3, or 4, with these separate dependencies yielding four distinct embodiments; and so on.

Embodiments of the invention in which an exclusive property or privilege is claimed are defined as follows.

The invention claimed is:
1. A method for purging contaminants from a vessel with vacuum-assistance, the method comprising:
 (a) after completion of a processing step, purging a vessel of environmental contaminants with a purging medium;
 (b) after the purging of the vessel, pressurizing the vessel at a charging station with a pressurizing medium to yield a desired atmosphere;

(c) transporting the vessel to a storage location that is separate from the charging station;
(d) storing the vessel in non-purge storage;
(e) leaving in non-purge storage for an amount of time; and
(f) repeating steps (a)-(e), if the vessel has not been utilized in another processing step.

2. The method of claim 1, wherein the purging medium is nitrogen (N2).

3. The method of claim 1, wherein the pressurizing medium is nitrogen (N2).

4. The method of claim 1, wherein the pressurizing medium is at least about 99.9% pure nitrogen (N2) gas.

5. The method of claim 1, wherein the vessel is a FOUP.

6. The method of claim 1, wherein the vessel is pressurized with the pressurizing medium to yield the desired atmosphere by using a positive pressure.

7. The method of claim 1, wherein the vessel is pressurized with the pressurizing medium to yield the desired atmosphere by using a negative pressure.

8. The method of claim 1, wherein the non-purge storage is a stocker.

9. A method for purging contaminants from a vessel with vacuum-assistance, the method comprising:
(a) after completion of a processing step for manufacturing semiconductor wafers, purging a vessel of environmental contaminants with a purging medium;
(b) after the purging of the vessel, pressurizing the vessel at a charging station with a pressurizing medium to yield a desired atmosphere, wherein the pressurizing medium is nitrogen (N2);
(c) transporting the vessel to a storage location that is separate from the charging station;
(d) storing the vessel in non-purge storage;
(e) leaving in non-purge storage for an amount of time; and
(f) repeating steps (a)-(e), if the vessel has not been utilized in another processing step for manufacturing semiconductor wafers.

10. The method of claim 9, wherein the purging medium is nitrogen (N2).

11. The method of claim 9, wherein the vessel is a FOUP.

12. The method of claim 9, wherein the vessel is pressurized with the pressurizing medium to yield the desired atmosphere by using a positive pressure.

13. The method of claim 9, wherein the vessel is pressurized with the pressurizing medium to yield the desired atmosphere by using a negative pressure.

14. The method of claim 9, wherein the non-purge storage is a stocker.

15. A method for purging contaminants from a FOUP with vacuum-assistance, the method comprising:
(a) after completion of a processing step for manufacturing semiconductor wafers, purging a FOUP of environmental contaminants with a purging medium;
(b) after the purging of the FOUP, pressurizing the FOUP at a charging station with a pressurizing medium to yield a desired atmosphere, wherein the pressurizing medium is nitrogen (N2);
(c) transporting the FOUP to a storage location that is separate from the charging station;
(d) storing the FOUP in non-purge storage;
(e) leaving in non-purge storage for an amount of time; and
(f) repeating steps (a)-(e), if the FOUP has not been utilized in another processing step for manufacturing semiconductor wafers.

16. The method of claim 15, wherein the purging medium is nitrogen (N2).

17. The method of claim 15, wherein the FOUP is pressurized with the pressurizing medium to yield the desired atmosphere by using a positive pressure.

18. The method of claim 15, wherein the FOUP is pressurized with the pressurizing medium to yield the desired atmosphere by using a negative pressure.

19. The method of claim 15, wherein the non-purge storage is a stocker.

* * * * *